United States Patent
Hamade et al.

[11] Patent Number: 6,055,199
[45] Date of Patent: Apr. 25, 2000

[54] TEST CIRCUIT FOR A SEMICONDUCTOR MEMORY DEVICE AND METHOD FOR BURN-IN TEST

[75] Inventors: Kei Hamade; Kiyohiro Furutani; Takashi Kono; Mikio Asakura, all of Tokyo, Japan

[73] Assignee: Mitsubishi Denki Kabushiki Kaisha, Tokyo, Japan

[21] Appl. No.: 09/176,880

[22] Filed: Oct. 21, 1998

[51] Int. Cl.$^7$ ..................................................... G11C 7/00
[52] U.S. Cl. ...................... 365/201; 365/203; 365/230.04
[58] Field of Search .................. 365/201, 203, 365/230.04, 189.09, 189.01

[56] References Cited

U.S. PATENT DOCUMENTS

| | | | |
|---|---|---|---|
| 5,265,057 | 11/1993 | Furuyama et al. | 365/201 |
| 5,357,193 | 10/1994 | Tanaka et al. | 365/201 |
| 5,381,373 | 1/1995 | Ohsawa | 365/201 |
| 5,590,079 | 12/1996 | Lee et al. | 365/201 |
| 5,638,331 | 6/1997 | Cha et al. | 365/201 |

FOREIGN PATENT DOCUMENTS

| | | |
|---|---|---|
| 4-225277 | 8/1992 | Japan . |
| 9-227600 | 9/1996 | Japan . |

OTHER PUBLICATIONS

"Wafer Burn–in (WBI) Technology for RAM's", Tohru Furuyama, et al. International Electron Devices Meeting, Technical Digest, 1993, pp. 639–642.

*Primary Examiner*—David Nelms
*Assistant Examiner*—David Lam
*Attorney, Agent, or Firm*—McDermott, Will & Emery

[57] ABSTRACT

A circuit for supplying a stress to memory cells of a semiconductor memory device having the plurality of the memory cells respectively connected to a word line and a bit line comprises a circuit for generating precharge voltage for bit line, a bit line precharging and equalizing circuit which is connected between said circuit for generating precharge voltage for bit line and said memory cells, a pad connected to the bit line precharging and equalizing circuit for applying a desirable voltage to said memory cells through the corresponding bit lines, and a circuit connected to the circuit for generating precharge voltage for bit line for generating a signal for stopping the operation of said circuit for generating precharge voltage for bit line, whereby cell checker patterns can easily be realized in order to screen out possible failures not only in gate oxide films but also in capacitor dielectrics, storage node junctions or the like by applying an arbitrary stress voltage from the outside of the device.

8 Claims, 13 Drawing Sheets

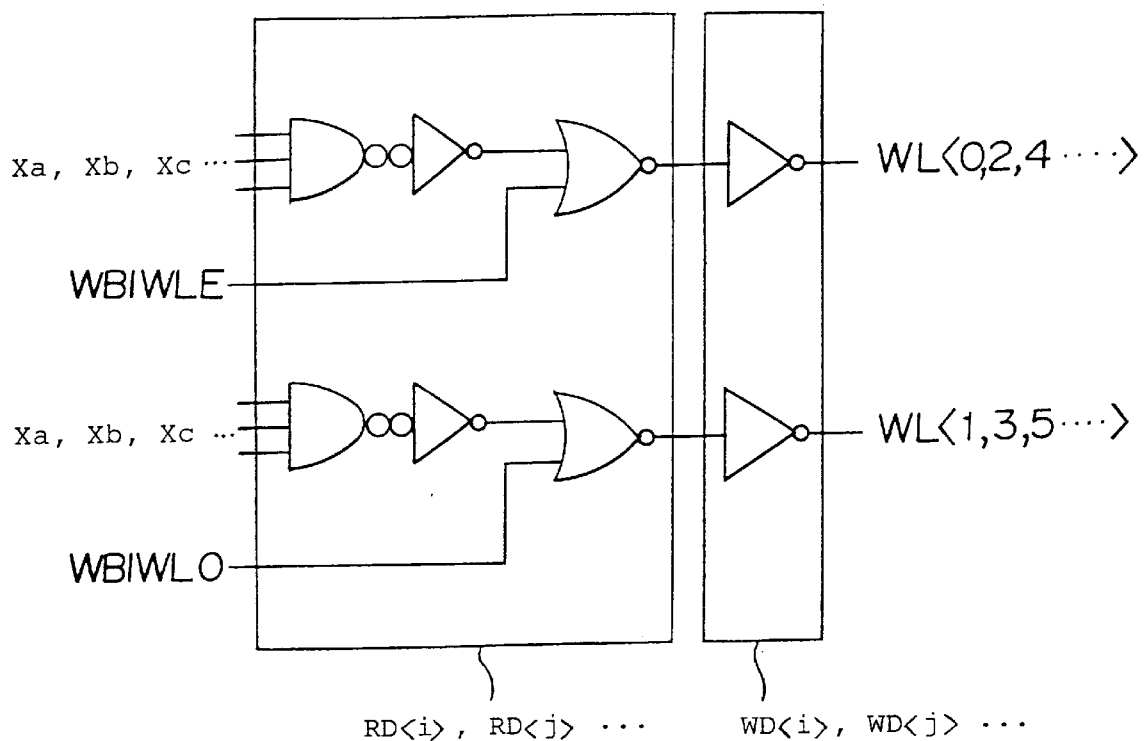
F I G. 5 b

TEST CIRCUIT FOR A SEMICONDUCTOR MEMORY DEVICE AND METHOD FOR BURN-IN TEST

BACKGROUND OF THE INVENTION

1. Field of the Invention

The present invention relates to a test circuit for a semiconductor memory device and a method for performing a test.

Particularly, the present invention relates to a test circuit for screening out failures such as a microshort of a gate oxide film of transistor, a p/n junction, a dielectric film of memory cell capacitor, between storage nodes of memory cell capacitors, between a storage node and a bit line, and between a storage node and a word line in a wafer-level burn-in test and a test equivalent thereto and to a method for screening out these failures in such tests.

More particularly, the present invention relates to a wafer-level burn-in test circuit, an outgoing test circuit and so on for realizing a checker pattern on a semiconductor memory device as a test pattern and to a method for performing such tests.

2. Discussion of Background

Conventionally, a burn-in test, of which purpose is to screen out by tangibly drawing out potential failures of a dynamic random access memory (DRAM), was performed in a step of outgoing test. In recent years, the situation was changed and the main stream is that a step of testing a DRAM is performed by a wafer-level burn-in (WLBI) in a wafer test step. By introducing the WLBI test, it is possible to screen potential failures in a DRAM out at an initial stage in steps for testing, whereby a yield in the step of outgoing test is stabilized and a cost for testing can resultantly be compressed.

In a conventional WLBI, a method of simultaneously activating word lines was proposed. According to the method, a principal objective was to boost a voltage applied to gate oxide films of memory cell transistors. FIG. 7 shows an example of a circuit structure according to a conventional WLBI circuit of simultaneously activating word lines, wherein references WL<i> and WL<j> respectively designate any one of word lines arranged in even order and any one of word lines arranged in odd order; references WD<i> and WD<j> designate word line driving circuits of working as an inverter, which circuits respectively correspond to the word lines WL<i>, WL<j>. . . ; and references ZWL<i> and ZWL<j> designate row decoding signals respectively corresponding to the word line driving circuits WD<i> and WD<j>.

In FIG. 8, references Xa, Xb, Xc designate row address signals; reference RD<i> designates one of row decoding circuits; reference WD<i> designates one of word line driving circuits corresponding to the row decoding circuit; reference ZWL<i> designates one of row decoding signals corresponding thereto; and reference WL<i> designates one of word lines corresponding thereto. In a usually used operation not in WLBI, for example, shown in FIG. 8, a row address Xa, Xb, Xc . . . input from an outside of chip is decoded by a row decoding circuit and a word line WL<i>is activated to conduct read operation, write operation and so on.

In FIG. 7, the row decoding signals ZWL<i> and ZWL<j>, which respectively become a level H under a non-selected state to respectively render word lines WL<i> and WL<j> a level L and become a level L under a selected state to respectively render the word lines WL<i> and WL<j> a level H, wherein the level H means a Vpp level sufficiently enough to write data of H to memory cells. The reference Vpp has a higher level than Vcc and is generated by a Vpp generating circuit usually provided in an inside of a chip. For example, in a case that Vcc is 3.3 V, Vpp is about 3.6 through 4.0 V.

In this method, a high voltage supplied from a pad for supplying a stress voltage (VWL) to word lines is applied to word lines through transistors such as Q4 and Q5, which transistors constitute a circuit for driving word lines. Specifically, when the WLBI test is performed, all of the word lines can be simultaneously boosted by applying a voltage of a high (H) level to a pad for controlling burn-in (BICNTL) and applying a predetermined high voltage to the pad (VWL), for example, as disclosed in U.S. Pat. No. 5,590,079.

However, in the WLBI according to the above-mentioned conventional method of simultaneously activating word lines, a voltage stress could be applied to only gate oxide films of memory cell transistors connected to thus activated word lines.

Also, there was a problem that an effective screening could not be performed because of insufficient voltage boosting with respect to memory cells.

Such insufficient voltage boosting was caused because one particular word line could be selected once in every thousands of cycles, for example, 1024 for 4M DRAM, 2048 or 4096 for 16M DRAM, and 4096 or 8192 for 64M DRAM. For example, on the assumption of a 50% word line duty ratio and "1/0" alternating cell data, a transfer gate of a particular memory cell was exposed to the maximum stress for 1/16K or 1/32K of the total burn-in period for the 64M DRAM case. Further, FIG. 3b schematically shows a structure of memory cells 6, wherein numerical reference 61 designates a gate oxide film; numerical reference 62 designates a p/n junction; numerical reference 63 designates a storage node; and numerical reference 64 designates a capacitor dielectric.

In order to conduct an effective screening, it is necessary to check possible leakage not only at gate oxide films 61 but also that at p/n junctions 62, storage nodes 63, capacitor dielectric films 64, or the like. For this, it is proposed that all transfer gates, namely gate oxide films 61, are simultaneously turned on and storage node potential (namely, bit line level) and capacitor plate bias are externally controlled, whereby a desired stress can be applied to the capacitor, particularly to its dielectric films or the junctions for the desired period without a stress relaxation.

In order to realize such condition, it is important to develop a technology of simultaneously probing as many chips on a wafer as possible. The WLBI time per chip is reduced as the number of chips simultaneously probed increases.

Although a wafer prober for testing a wafer shown in FIGS. 9 through 11 is not exclusively used for a WLBI test, it can be used for testing a semiconductor memory device by WLBI.

Such a wafer prober is disclosed, for example, in the journal "Nikkei Micro Device Vol. 1998/8", pages 61 through 65. Structure and function of a wafer prober will be described with reference to FIGS. 9 through 11.

In FIGS. 9 through 11, numerical reference 10 designates a wafer; numerical reference 11 designates a wafer prober; numerical reference 12 designates a test head; numerical reference 13 designates a probe card; numerical reference 14 designates a probe pin; numerical reference 15 designates a wafer chuck; numerical reference 16 designates a card holder; numerical reference 20 designates a test station; numerical reference 21 designates a test-cable; and numerical reference 22 designates a tester I/F or GP-1B.

FIG. 9 shows a system for wafer test; FIG. 10 shows a wafer chuck 15 and peripheral portions thereto in a wafer prober 11; and FIG. 11 schematically shows a cross-section of a test head 12, the wafer chuck 15 of the wafer prober 11, and peripheral portions thereto.

Generally, processes of manufacturing a semiconductor device includes a first process of forming a circuit pattern and a second process of cutting a wafer, bonding, and packaging. In the end of the first process, a wafer testing step is performed to test a test chip such as a device in a semiconductor wafer 10 to be loaded for judging whether or not the test chip is acceptable.

As shown in FIG. 9, a system for wafer test comprises a test station 20 for performing the test of the test chip, a probe card 13 to be in contact with pads of the test chip, and a wafer prober 11 for transferring a wafer 10 and positioning probe pins 14. Above a head plate, a test head 12 of the test station 20 is located. Further, the probe card 13 is attached to the head plate. The test station 20 sends and receives a test signal to and from the test chip on the wafer 10 through contacts with the probe pins 14 of the probe card 13, whereby the test is performed.

In order to tangibly draw out the above-mentioned possible leakages, it is necessary to simultaneously probe as many chips on the wafer as possible and to provide additional probe pins 14 for simultaneously activating gate oxide films and externally controlling the storage node potential and the capacitor plate bias.

However, in accordance with the recent increment of a DRAM capacity, it became difficult that these increased and/or additional probe pins 14 were provided in a probe card 13. Therefore, if a DRAM is originally designed aiming a WLBI application, it is quite easy to implement a mechanism where almost all the circuits in the DRAM are activated including column circuits while using an embedded address counter and minimizing the number of WLBI pads, as disclosed in IEDM '93 p. 639–642, International Electron Devices Meeting, Technical Digest.

However, the usage of such an embedded address counter still makes the WLBI test complicated.

Incidentally, in order to test a microshort between word lines, it was proposed in U.S. Pat. No. 5,265,057 that adjacent memory cells in a DRAM respectively had a state of high (H) or a state of low (L) so as to form a checker pattern. Namely, viewing all of the memory cells when memory cells in the state H are shaded and memory cells in the state L are blanked, the DRAM schematically exhibit a checker pattern However, the checker pattern was conventionally used to check only the microshort between word lines because of the above-mentioned restriction in probe cards and the above-mentioned structure of the test circuit. Thus, it could not be used to screen out the other potential failures.

Further, in a conventional WLBI circuit of a semiconductor memory device, it was impossible to perform a test equivalent to the WLBI test after packaging the device because the device was designed such that terminal pins or pads necessary for the test were covered with the package shell, since it is not preferable that users can access these and in consideration of a small packaging requiring the least outer terminals.

SUMMARY OF THE INVENTION

It is an object of the present invention to solve the problems inherent in the above-mentioned conventional WLBI and to realize effective voltage boosting not only to a gate oxide film of transistor but also to a p/n junction of transistor, a dielectric film of memory cells, between storage nodes, between a storage node and a bit line, and between a storage node and a word line for screening out a microshort.

Specifically, it is an object of the present invention to provide a method of effectively screening out a microshort between memory cells and to provide a circuit for realizing this method.

According to a first aspect of the present invention, there is provided a circuit for supplying a stress to memory cells of a semiconductor memory device equipped therein having a plurality of the memory cells respectively connected to a word line and a bit line comprising: a circuit for generating a precharge voltage for bit line, a bit line precharging and equalizing circuit which is connected between said circuit for generating precharge voltage for bit line and said memory cells, a pad connected between said bit line precharging and equalizing circuit and the circuit for generating a precharge voltage for bit line for applying a desirable voltage to said memory cells through the bit lines, and a stop signal generating circuit for generating a signal for stopping the operation of said circuit for generating precharge voltage for bit line, which is connected to said circuit for generating precharge voltage for bit line.

According to a second aspect of the present invention, there is provided a circuit for applying a stress to memory cells according to the first aspect of the present invention, wherein said stop signal generating circuit outputs a stop signal depending on a signal for selecting a wafer-level burn-in, a first mode selection signal for selecting bit lines arranged in even order, and a second mode selection signal for selecting bit lines arranged in odd order so that when said signal for selecting the wafer-level burn-in is in a level H and either said first mode selection signal or said second mode selection signal is in the level H, said signal for stopping the circuit for generating precharge voltage for bit line becomes the level H.

According to a third aspect of the present invention, there is provided a circuit for applying a stress to memory cells according to the first aspect of the present invention, wherein said stop signal generating circuit outputs a stop signal depending on a signal for selecting a wafer-level burn-in, a first mode selection signal for selecting bit lines arranged in even order, a second mode selection signal for selecting bit lines arranged in odd order, and address signals especially allocated to state other tests than the wafer-level burn-in test so that when said signal for selecting the wafer-level burn-in is in a level H and either said first mode selection signal or said second mode selection signal is in the level H, said signal for stopping the circuit for generating precharge voltage for bit line becomes the level H; and said address signals are combinably applied to output said signal for stopping the circuit for generating precharge voltage for bit line irrespective of said signal for selecting a wafer-level burn-in, said first mode selection signal, and said second selection signal.

According to a fourth aspect of the present invention, there is provided a method of supplying a stress to memory cells of a semiconductor memory device comprising: a step of selecting from among a mode for simultaneously activating word-lines arranged in odd order, a mode for simultaneously selecting word lines arranged in even order, and a mode for simultaneously activating the whole word lines, a step of selecting execution of a wafer-level burn-in test, a step of determining whether or not a signal for stopping output of precharge voltage for bit line is output when the execution of the wafer-level burn-in test is determined and one of said modes is simultaneously selected, a step of floating a precharge voltage for bit line upon receipt of said signal for stopping output of precharge voltage for bit line, and a step of supplying an arbitrary voltage to said memory cells as the stress after said signal for stopping output of precharge voltage for bit line is output.

According to a fifth aspect of the present invention, there is provided a method of supplying a stress to memory cells of a semiconductor memory device comprising: a step of selecting from among a mode for simultaneously activating word lines arranged in odd order, a mode for simultaneously selecting word lines arranged in even order, and a mode for simultaneously activating the whole word lines, a step of selecting execution of a wafer-level burn-in test, a step of determining whether or not a first signal for stopping output of precharge voltage for bit line is output when the execution of the wafer-level burn-in test is determined and one of said mode is simultaneously selected, a step of floating a precharge voltage for bit line upon receipt of said first signal for stopping output of precharge voltage for bit line, a step of supplying an arbitrary voltage to said memory cells as the stress after said first signal for stopping output of the precharge voltage for bit line is output, a step of selecting execution of a test other than the wafer-level burn-in test by means of address signals, a step of determining whether or not a second signal for stopping output of precharge voltage for bit line is output when execution of said other test is selected, a step of floating the precharge voltage for bit line upon receipt of said second signal for stopping output of precharge voltage for bit line, and a step of supplying an arbitrary voltage to said memory cells as the stress after said second signal for stopping output of the precharge voltage for bit line is output.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5b is a logical diagram of an example of row decoding circuit which can achieve a mode of simultaneously selecting word lines in odd order and even order;

DETAILED DESCRIPTION OF THE PREFERRED EMBODIMENTS

A detailed explanation will be given of preferred embodiments of the present invention in reference to Figures attached thereto, wherein the same numerical references are used for the same or the similar portions and description of these portions is omitted.

Embodiment 1

Figure 1:
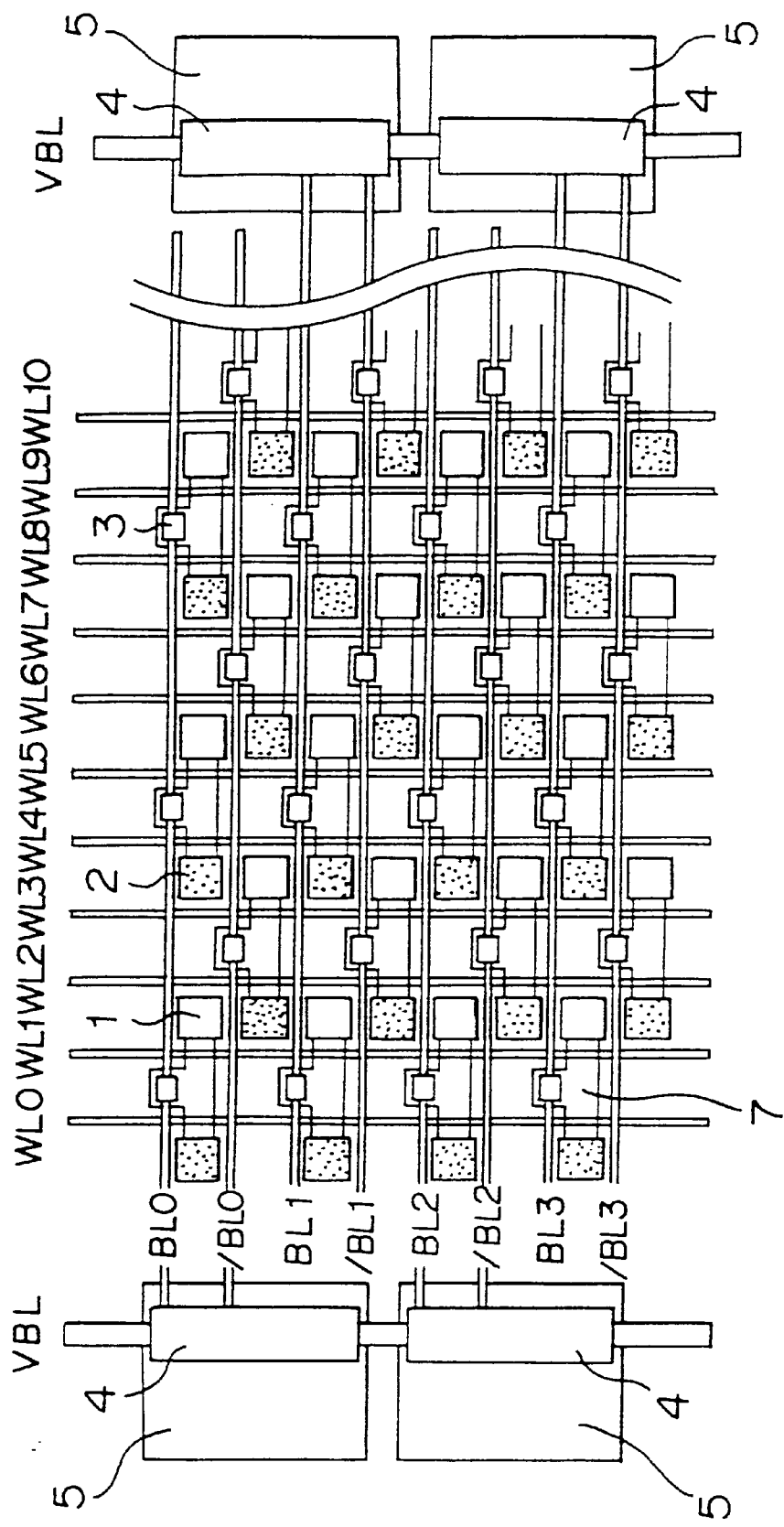
FIG. 1 schematically shows a partially omitted structure of a memory cell array in one of memory cell checker patterns according to the present invention.
Figure 2:
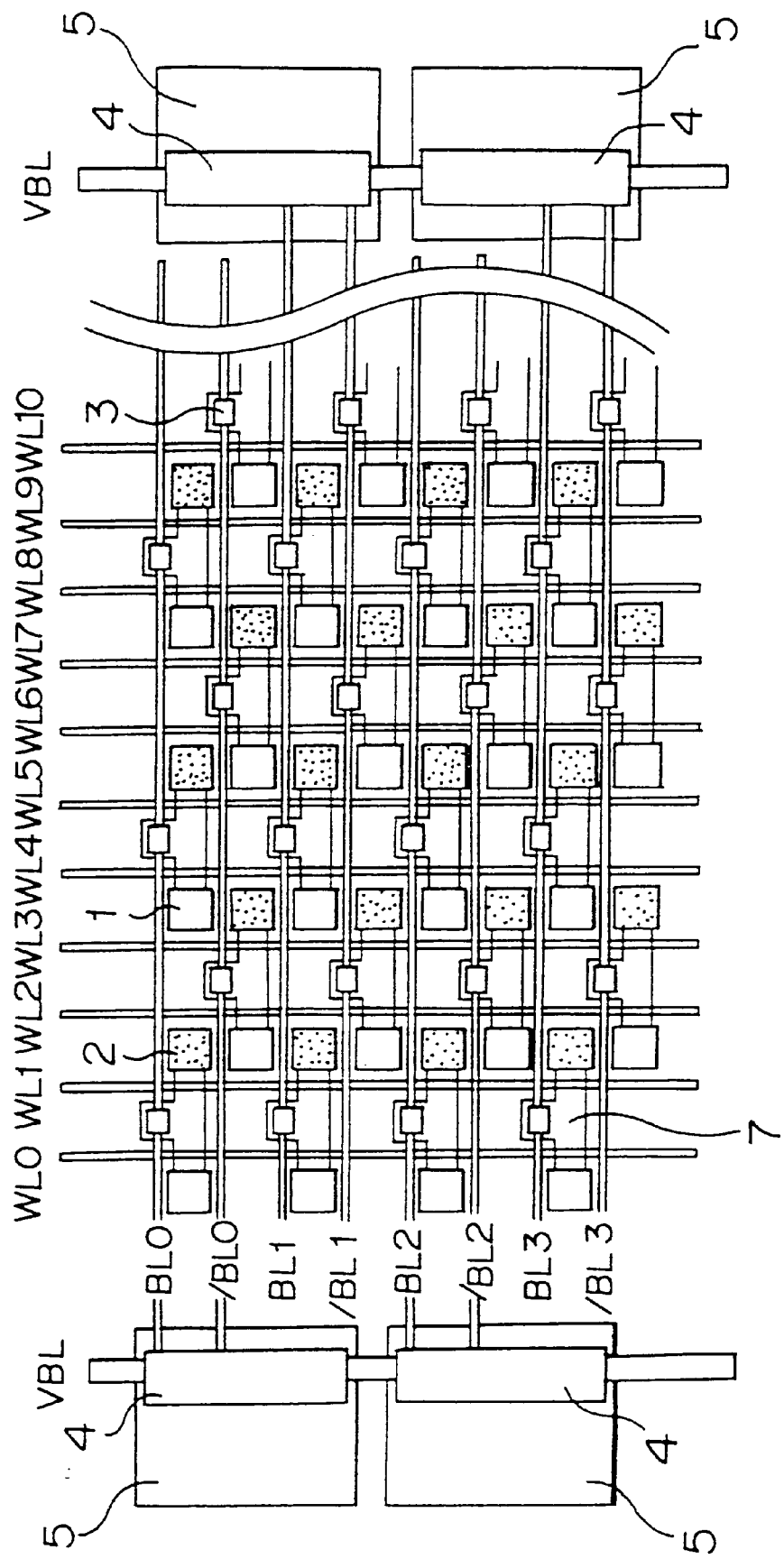
FIG. 2 schematically shows the partially omitted structure of the memory cell array in the other state of memory cell checker pattern according to the present invention.

FIGS. 1 and 2 schematically show a memory cell array of a DRAM by partially omitting a part of the DRAM for the purpose of readiness. Numerical reference 1 designates a memory cell capacitor having data of high (H), and numerical reference 2 a memory cell capacitor having data of low (L). Although both of FIGS. 1 and 2 exhibit similar cell checker patterns formed by the memory cell capacitors 1 and 2, the patterns are reversely designed between the FIGS. 1 and 2. Numerical reference 3 designates a contact for connecting a drain of memory cell transistor to a bit line. References VBL designate a precharge voltage line for bit line. References BL0 and /BL0, BL1 and /BL1, BL2 and /BL2, and BL3 and /BL3 designate a pair of bit lines. References WL0, WL1, WL2, WL3, WL4, WL5, WL6, WL7, WL8, WL9, and WL10 designate a word line. Numerical references 4 which are attached to the VBL designate bit line (BL) precharging and equalizing circuits. Numerical references 5 designate areas of sense amplifier. Numerical references 7 designate an active region.

As shown in FIGS. 1 and 2, when the cell checker patterns are written in the memory cells 1 and 2 so that adjacent cells have reverse data to each other and potential-differences occur between adjacent memory cells. Specifically, each of the memory cells 1 and 2 has its own memory cell capacitor so that an electric charge is stored in the memory cell capacitor to have a corresponding electric potential, by which the data H or data L is determined. The difference between the data H and the data L produces a high potential difference between memory cells to thereby tangibly draw out potential microshorts at a gate oxide film and a p/n junction of transistor, at a dielectric film of memory cell capacitor, between storage nodes of memory cell capacitors, between a storage node and a bit line, between a storage node and a word line, and so on.

In the memory cell array structure shown in FIGS. 1 and 2, memory cells coupled to word lines arranged in even address numbers WL0, WL2, WL4, WL6, WL8, and WL10 are coupled to bit lines BL0, BL1, BL2, and BL3, and memory cells coupled to word lines arranged in odd address numbers WL1, WL3, WL5, WL7, and WL9 are coupled to bit lines /BL0, /BL1, /BL2, and /BL3. Accordingly, either by activating all of the word lines of the even address numbers and simultaneously writing the data H (high voltage) in the bit lines BL0, BL1, BL2, and BL3 or by activating all of the word lines of the odd address numbers and simultaneously writing the data H in the bit lines /BL0, /BL1, /BL2, and /BL3, it is possible to realize the cell checker patters.

Figure 3A:
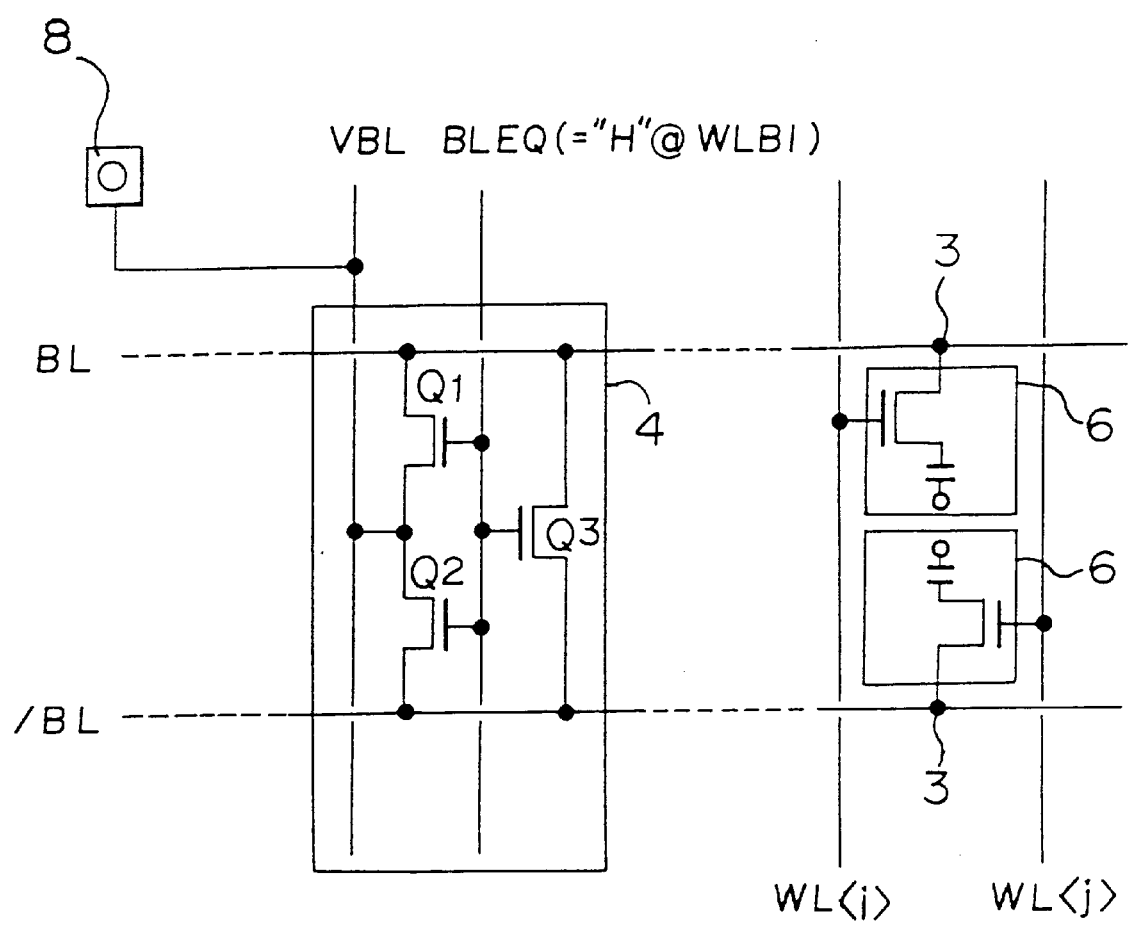
FIG. 3a is a circuit diagram of bit line precharging and equalizing circuit in connection with memory cells and an outer pad according to the present invention.
Figure 3B:
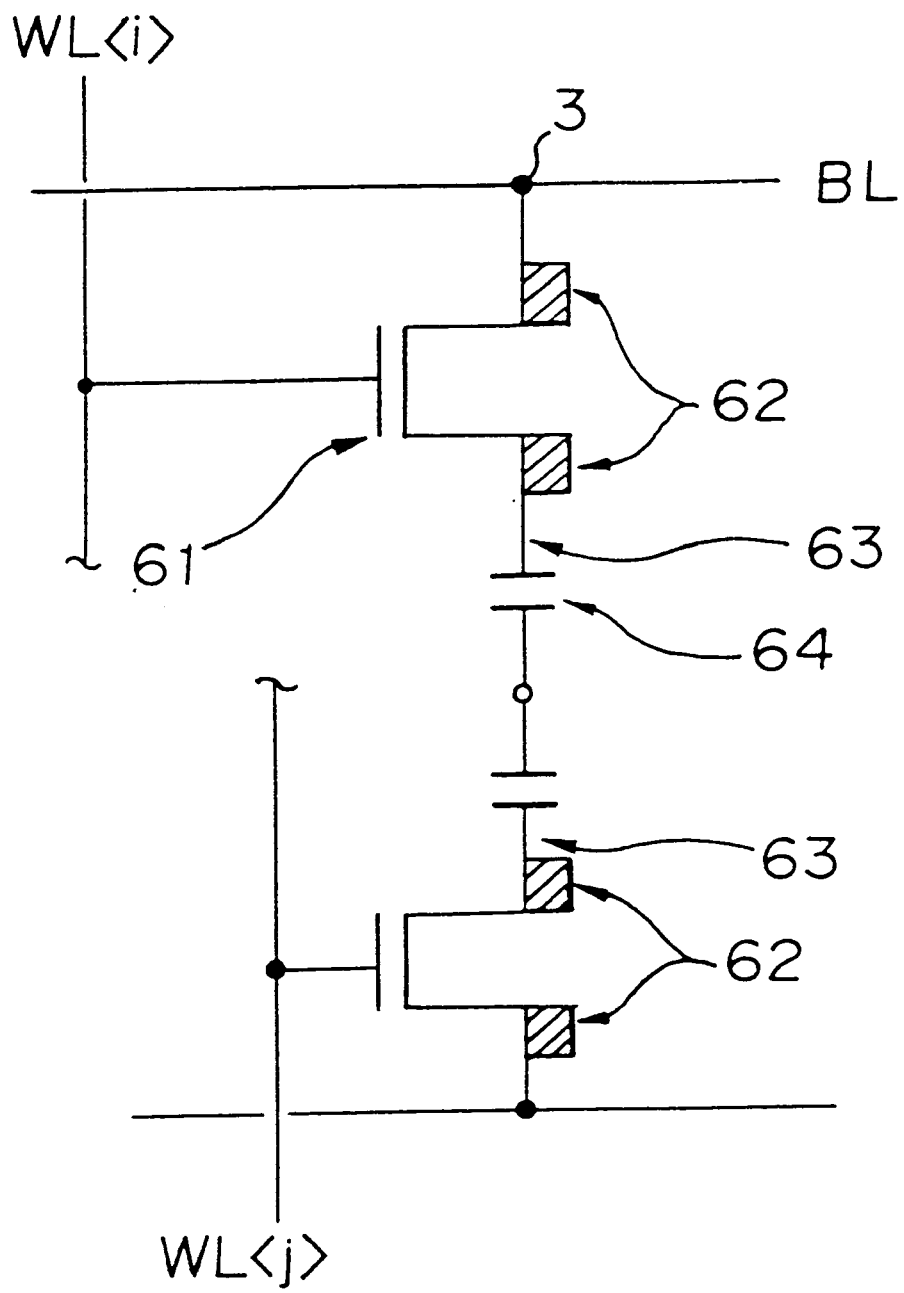
FIG. 3b schematically shows a structure of a pair of memory cells along with word lines and bit lines.
Figure 3C:
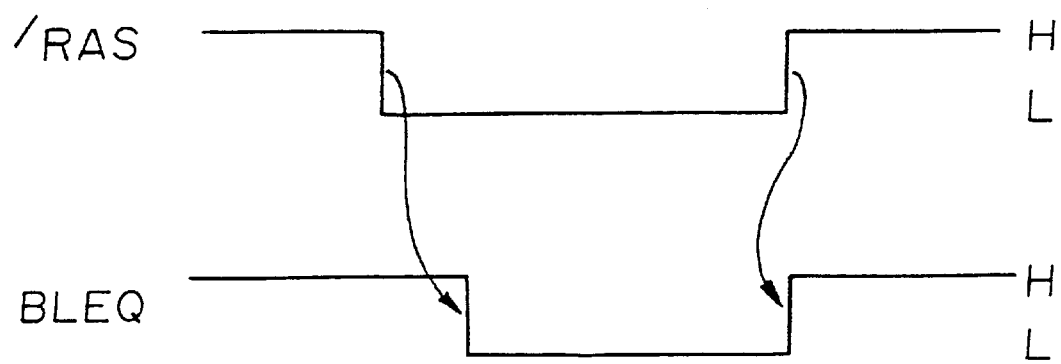
FIG. 3c is a timing chart of a signal of row address strobe signal (/RAS) and a bit line equalizing signal (BLEQ) under generally used operation.
Figure 3D:
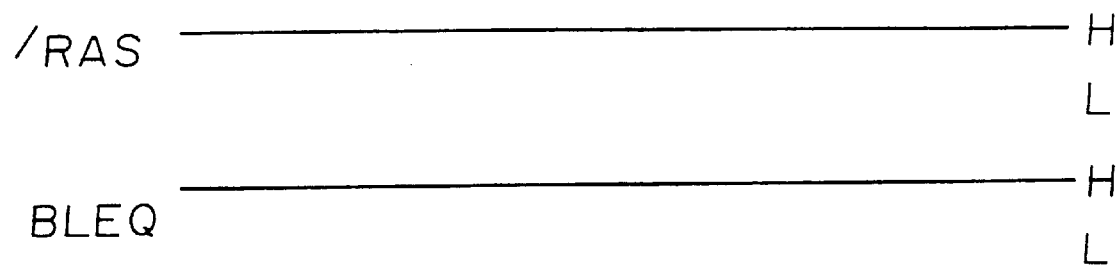
FIG. 3d is a timing chart of a signal of /RAS and a signal of BLEQ under a wafer-level burn-in test.

FIG. 3a shows a bit line precharging and equalizing circuit, in which references BL, /BL designate any one of pairs of bit lines; references WL<i> and WL<j> designate any one of word lines arranged in even order and any one of word lines arranged in odd order respectively; numerical references 6 designate a memory cell in which a transistor and the capacitor are included, which correspond to the numerical references 1 or 2 in FIGS. 1 and 2; and numerical reference 8 designates a monitor pad. Reference BLEQ designates a bit line equalizing signal. In FIG. 3c, BLEQ becomes a level L when an outer /RAS (i.e. row address strobe) signal is in a level L for starting read/write operation and becomes a level H when the outer /RAS signal is in a level H. When a WLBI test described in the present invention is performed, the /RAS signal is kept in the level H, without changing it from the level H to the level L, as long as the WLBI test of the present invention is static without using an address counter, BLEQ remains to be the level H as shown in FIG. 3d, wherein the usually used operation is not conducted.

In FIG. 3a, references Q1, Q2, and Q3 designate bit line equalizing transistors. An externally applied VBL from the pad 8 can be supplied to BL, /BL as a preferable voltage level through these transistors Q1, Q2, and Q3 because BLEQ is maintained to be H as shown in FIG. 3d.

In this, the writing of the data H into the bit lines BL0, BL1, BL2, and BL3 or that into the bit lines /BL0, /BL1, /BL2, and /BL3 can be realized by applying the precharge voltage for bit line (VBL) from the monitor pad 8 shown in FIG. 3a. At this time, the circuit for generating the precharge voltage for bit line (VBL generating circuit) is not operated.

Figure 4:
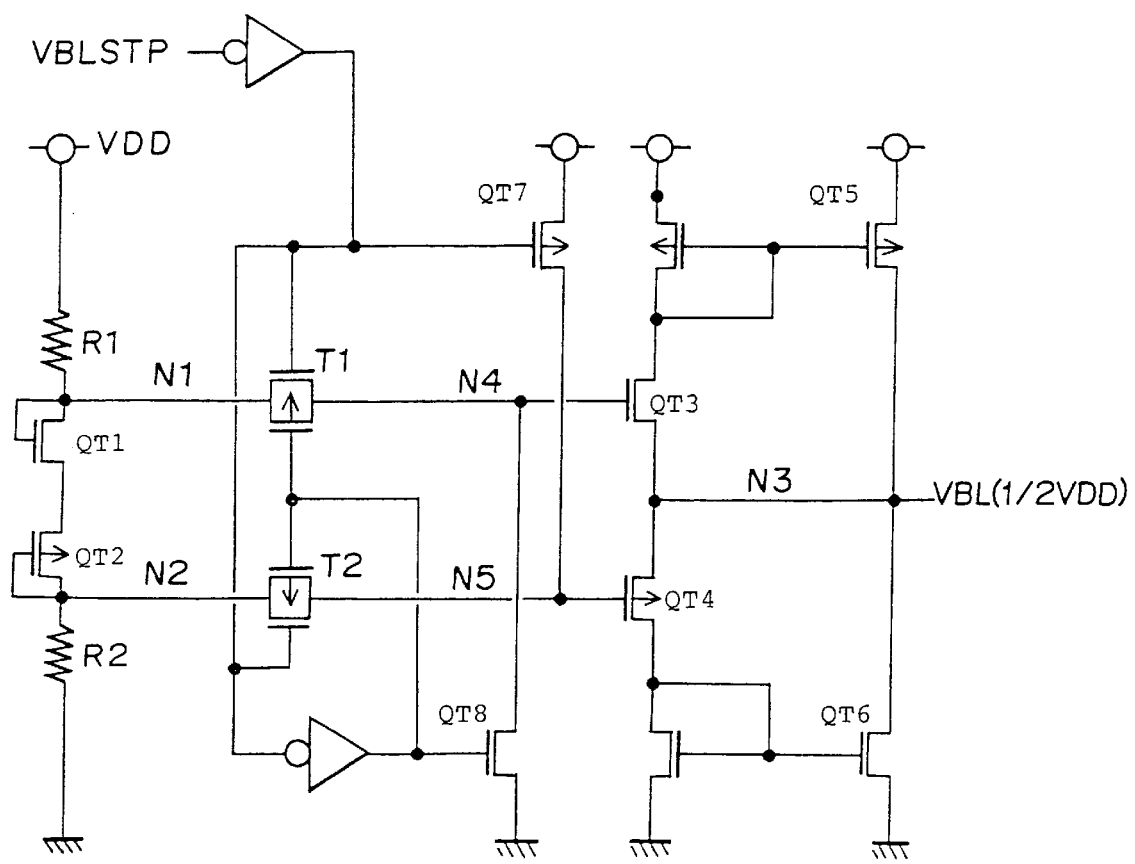
FIG. 4 is a circuit diagram for generating a precharge voltage for bit line (VBL) generally used in a conventional wafer-level burn-in (WLBI) test.

FIG. 4 shows an example of the circuit structure for the VBL generating circuit which can realize such operation. The circuit operation will be described in the below.

In FIG. 4, reference voltages appearing in references N1 and N2, which voltages respectively generated by registers R1 or R2 and transistors QT1 or QT2 coupled to the registers R1 or R2 to work as a diode, are transmitted through transmission gates T1 and T2 so as to be applied to the gates of transistors QT3 and QT4. As a result, the VBL having a half of VDD is output from a node N3 and supplied to the whole area in the chip with the assistance of buffer transistors QT5 and QT6, both of which have a large capability for current driving.

Figure 5A:
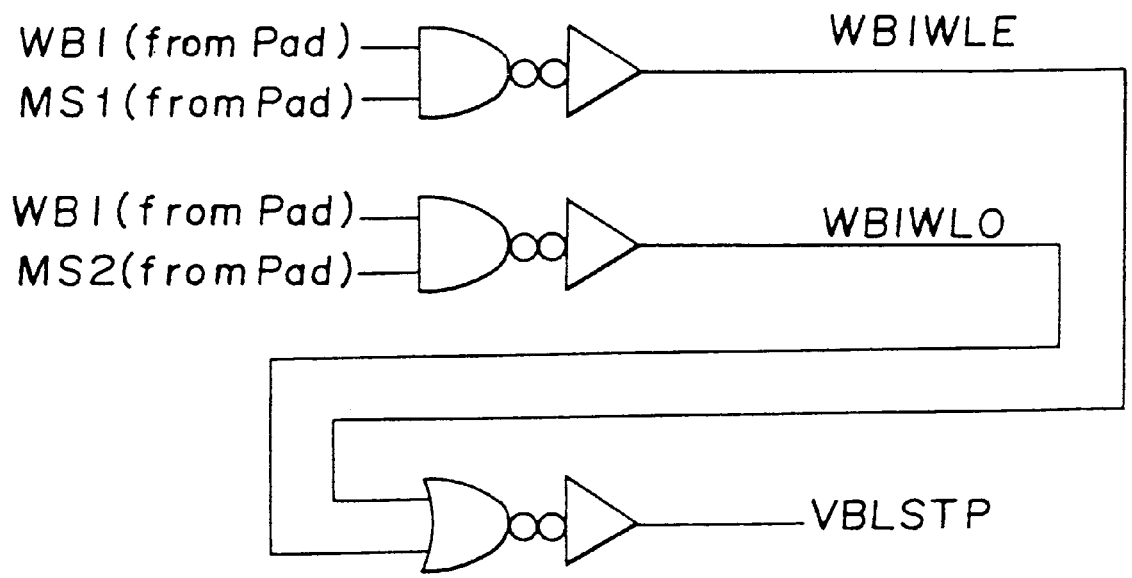
FIG. 5a is a logical circuit diagram of a circuit for outputting a signal for deactivating a VBL generating circuit according to Embodiment 1 of the present invention.

A signal VBLSTP shown in FIGS. 4 and 5a designates a signal for stopping VBL. The signal VBLSTP is input in the VBL generating circuit shown in FIG. 4 from its upper end portion. In an ordinary operation, the signal VBLSTP is in the L level according to operation which will be described in the following, whereby the transmission gates T1 and T2 are in the ON state and thereby the levels N1 and N2 are supplied to the gates of the transistors QT3 and QT4 as voltages N4 and N5 respectively. As a result, the VBL is output from the VBL generating circuit.

Incidentally, in WLBI, the signal VBLSTP shown in FIG. 4 is in the level H according to operation which will be described in the following, whereby transistors QT7 and QT8 are turned ON. Accordingly, the voltages N4 and N5 respectively become the drain supply d.c. voltage (VDD) level and the ground (GND) level; the transistors QT3 and QT4 are turned OFF; and therefore a voltage N3 becomes a floating state (i.e. high impedance state). In such situation, it is possible to securely supply the VBL by applying a predetermined high voltage through a pad connected to the VBL. FIG. 3a shows paths for supplying the VBL from the area of sense amplifiers to the memory cells.

FIG. 5a shows an example of a logic circuit which can realize a test mode entry to the above-mentioned mode for activating word lines of even numbers and/or these of odd numbers. Circuit operation will be described.

When a signal of wafer-level burn-in (WLBI) from a pad is in the level H and a signal of mode selection (MS1) from a pad is in the level H, a signal of wafer-level burn-in with word lines of even number selected (WBIWLE) becomes the level H. Similarly, when the signal WBI from the pad is in the level H and a signal of mode selection (MS2) from a pad is in the level H, a signal of wafer-level burn-in with word lines of odd number selected (WBIWLO) becomes the level H. Therefore, when the pad for WBI is in the level H and either the pad for MS1 or the pad for MS2 is in the level H by controlling switching between the even number and the odd number, the signal WBIWLE or the signal WBIWLO becomes the level H. In accordance with this, the signal VBLSTP for deactivating the VBL generating circuit becomes the level H, whereby a desirable VBL voltage can be applied from the outer pad 8. By maintaining the signal WBI in the level H and changing the signal MS1 or the signal MS2 alternatively to the level H, it is possible to realize bi-directional voltage boosting to adjacent memory cell capacitors. In other words, by reversely switching the relation of electric potential between the adjacent cells, namely by changing the cell checker patterns as shown in FIG. 1 and FIG. 2, it is possible to realize more effective voltage boosting.

FIG. 5b shows an example of logical circuit of a row decoder RD<i>, RD<j>... and a word driver WD<i>, WD<j>... which can realize a mode of simultaneously selecting word lines both in even order and odd order. In FIG. 5b, references Xi, Xj, Xk designate row address signals. In this embodiment, the row decoder shown in FIG. 5b, for example, is connected to the circuit shown in FIG. 5a to cooperate with each other for selecting word lines. When the word lines both in even order and odd order are simultaneously selected, the row decoder for selecting the word lines in even order receives the signal of WBIWLE to thereby activate the word lines in even order and the row decoder for selecting the word lines in odd order receives the signal of WBIWLO to thereby activate the word lines in odd order as shown in FIG. 5b.

Embodiment 2

Figure 6:
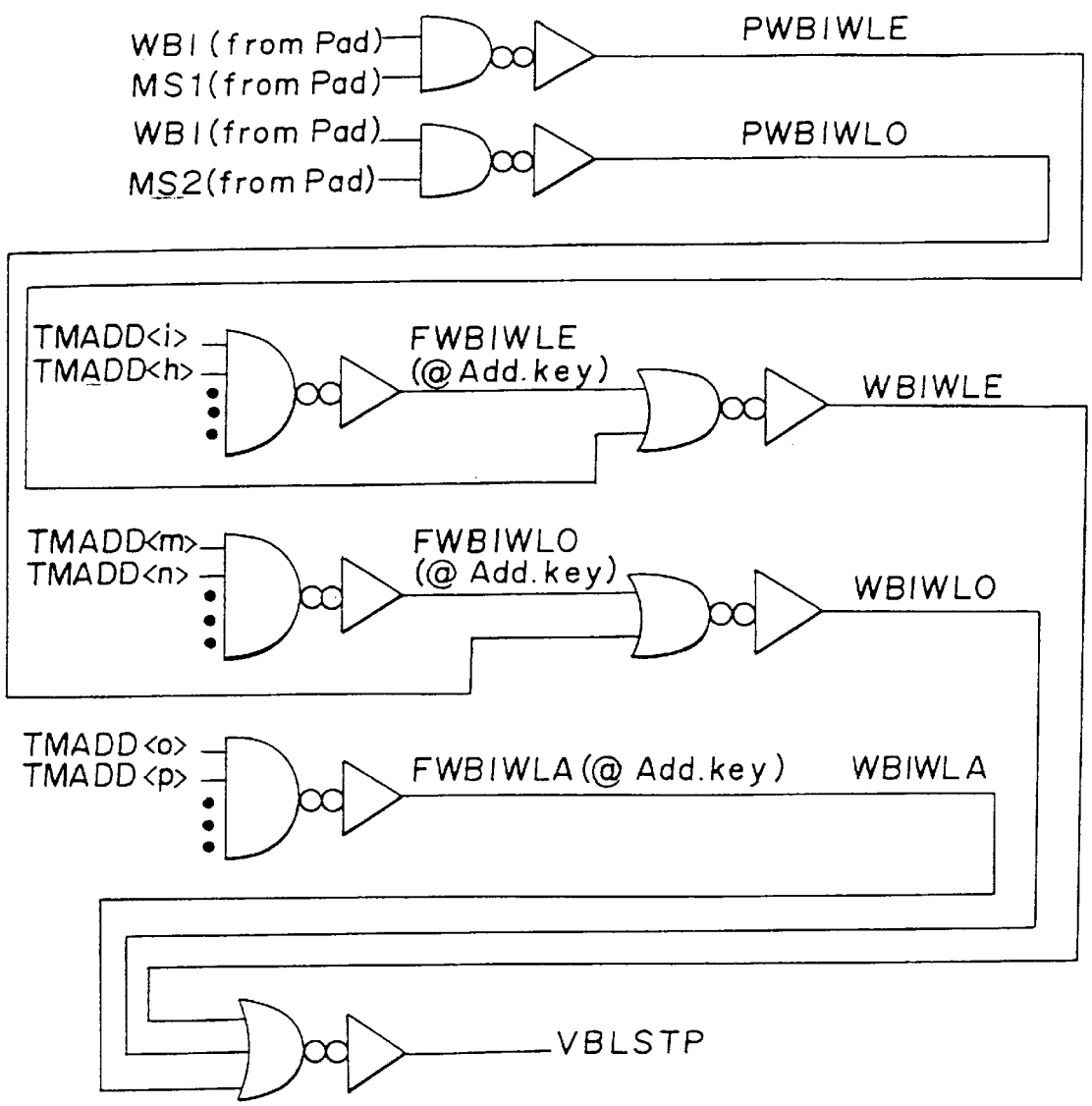
FIG. 6 is a logical circuit diagram of a circuit for outputting a signal for deactivating a VBL generating circuit according to Embodiment 2 of the present invention.
Figure 7:
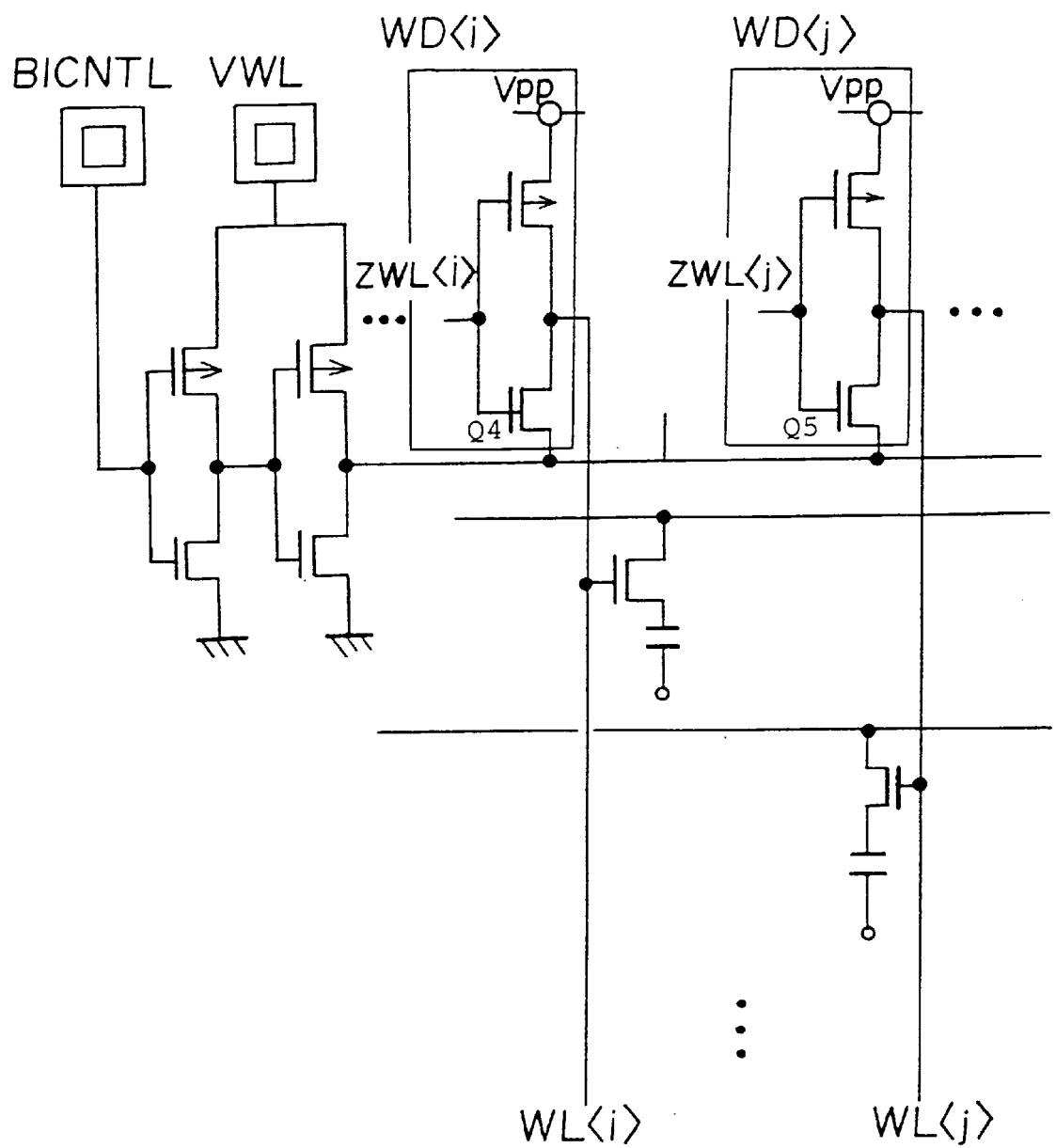
FIG. 7 shows a part of a circuit of a conventional DRAM for simultaneously activating word lines in a WLBI test.
Figure 8:
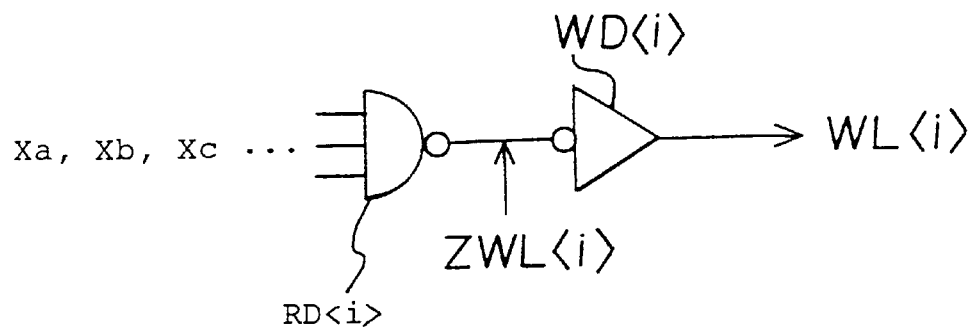
FIG. 8 is a logical diagram of word line driving circuit including a row decoding circuit for receiving row address signals and outputting a row decoding signal and a word line driving circuit for receiving the row decoding signal and outputting to a word line.
Figure 11:
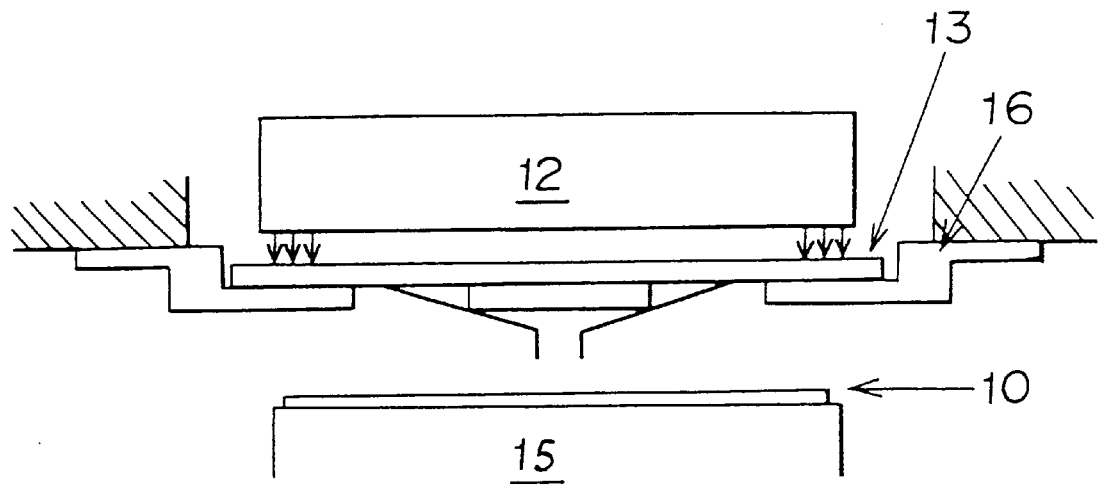
FIG. 11 schematically shows a cross-sectional view of a test head and the wafer chuck of a wafer prober.
Figure 9:
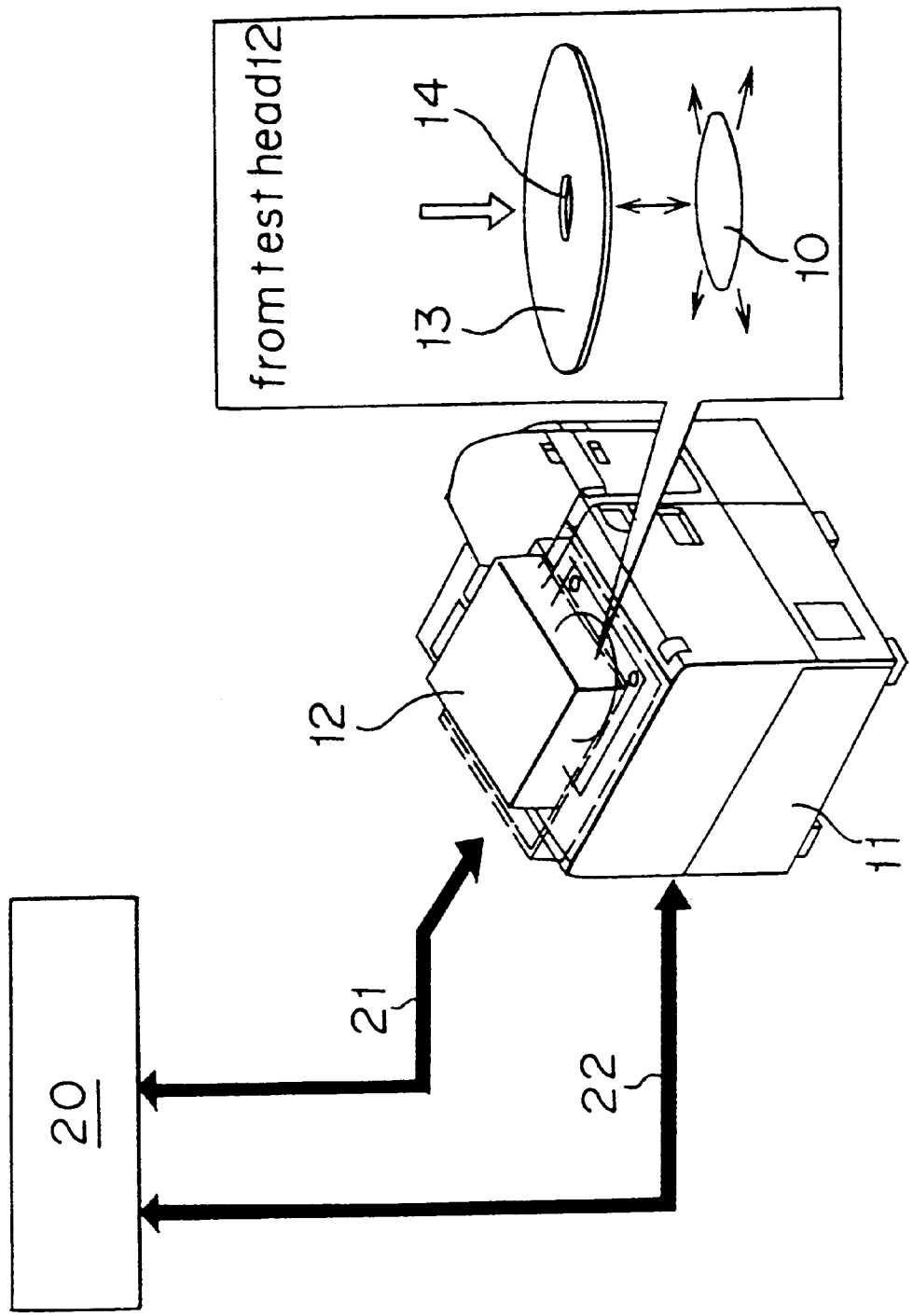
FIG. 9 shows a system for wafer test.
Figure 10:
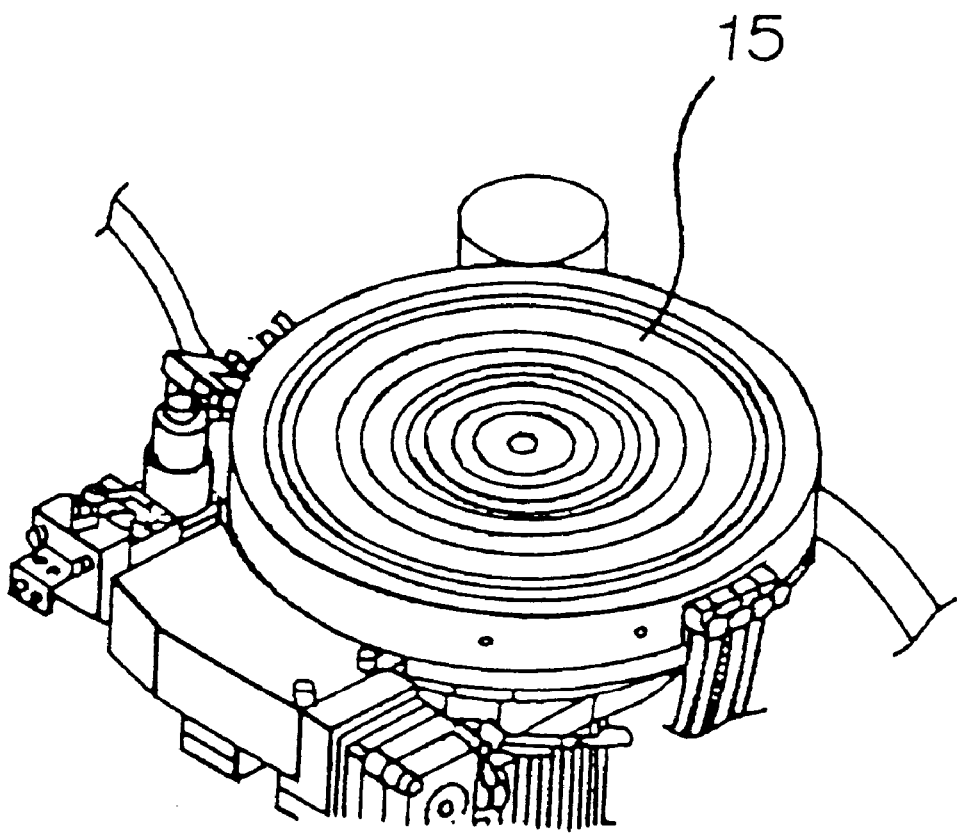
FIG. 10 shows a wafer chuck in a wafer prober.

FIG. 6 shows an example of logic circuit which can realize the WLBI described in Embodiment 1 also in a step of outgoing test after packaging. In FIG. 6, a circuit structure which enables an entry to a WLBI test mode with use of an address key is shown. Similarly to the operation described in Embodiment 1, when the signal WBI from the pad is in the level H and the signal MS1 from the pad is in the level H, a signal to pad for wafer-level burn-in with word lines of even numbers selected (PWBIWLE) becomes the level H. Also, the signal WBI from the pad is in the level H and the signal MS2 from the pad is in the level H, a signal to pad for wafer-level burn-in with word lines of odd numbers selected (PWBIWLO) becomes the level H.

Accordingly, as described in Embodiment 1, when the pad for the WBI is in the level H and either the pad for the MS1 or the pad for the MS2 is in the level H for controlling switching between the selection of even number and the selection of odd number, the signal PWBIWLE or the signal PWBIWLO becomes the level H. On the other hand, a signal of final wafer-level burn-in with word lines of even numbers selected (FWBIWLE) or a signal of final wafer-level burn-in with word lines of odd numbers selected (FWBIWLO) becomes the level H by predetermined address keys composed of address signals such as test mode addresses TMADD<i>, TMADD<h>, and so on, which are set in a test mode resistor (not shown) to be arranged in a predetermined sequence. When either the signal PWBIWLE or the signal FWBILE is in the level H, the signal WBIWLE is activated. Similarly, either the signal PWBIWLO or the signal FWBILO is in the level H, the signal WBIWLO is activated. Accordingly, either the signal PWBIWLE or the signal FWBIKLE is activated, it is possible to write the cell checker pattern shown in FIG. 1; and when either the signal PWBIWLO or the signal FWBILO is activated, it is possible to write the cell checker pattern shown in FIG. 2.

Further, when both of the signal PWBIWLE and the signal PWBIWLO are activated, it is possible to simultaneously activate all of the word lines; and when both of the signal FWBIWLE and the signal FWBIWLO are activated, it is also possible to simultaneously activate all of the word lines.

Although the application of the signal VBL in the WLBI after packaging is not specifically shown, it is possible to apply the VBL from a desirable input/output pin.

By activating only the signal FWBIWLA, it is also possible to simultaneously activate all of the word lines without activating any of the signals PWBIWLE, PWBIWLO, FWBIWLE, and FWBIWLO.

As described in the above, the present invention provides an effect of easily and securely realizing voltage boosting to capacitors included in memory cells therein at the time of WLBI.

Further, the invention provides an effect of conducting a test equivalent to the WLBI test, which is ordinarily conducted in a wafer test step, even after packaging.

Further, the invention provides an effect of improving screening efficiency, whereby improvement in throughput and cost reduction are obtainable in consideration of the whole test steps.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit for supplying a stress to memory cells of a semiconductor memory device equipped therein having a plurality of the memory cells respectively connected to a word line and a bit line, comprising:

a circuit for generating a precharge voltage for bit line, a bit line precharging and equalizing circuit which is connected between said circuit for generating precharge voltage for bit line and said memory cells, a pad connected between said bit line precharging and equalizing circuit and the circuit for generating a precharge voltage for bit line for applying a desired voltage to said memory cells through the bit lines, and a stop signal generating circuit for generating a stop signal for stopping the operation of said circuit for generating precharge voltage for bit line, which is connected to said circuit for generating the precharge voltage for bit line, wherein said stop signal generating circuit outputs the stop signal depending on a signal for selecting a wafer-level burn-in, a first mode selection signal for selecting bit lines arranged in even order, and a second mode selection signal for selecting bit lines arranged in odd order so that when said signal for selecting the wafer-level burn-in is at a prescribed logic level and either said first mode selection signal or said second mode selection signal is at the prescribed logic level, said stop signal for stopping the circuit for generating precharge voltage for bit line is at the prescribed logic level.

2. A circuit for supplying a stress to memory cells according to claim 1, wherein said prescribed logic level is an H level.

3. A circuit for supplying a stress to memory cells of a semiconductor memory device equipped therein having a plurality of the memory cells respectively connected to a word line and a bit line, comprising:

a circuit for generating a precharge voltage for bit line, a bit line precharging and equalizing circuit which is connected between said circuit for generating precharge voltage for bit line and said memory cells, a pad connected between said bit line precharging and equalizing circuit and the circuit for generating a precharge voltage for bit line for applying a desired voltage to said memory cells through the bit lines, and a stop signal generating circuit for generating a stop signal for stopping the operation of said circuit for generating precharge voltage for bit line, which is connected to said circuit for generating precharge voltage for bit line, wherein said stop signal generating circuit outputs a stop signal depending on a signal for selecting a wafer-level burn-in, a first mode selection signal for selecting bit lines arranged in even order, a second mode selection signal for selecting bit lines arranged in odd order, and address signals especially allocated to state other tests than the wafer-level burn-in test so that when said signal for selecting the wafer-level burn-in is at a prescribed logic level and either said first mode selection signal or said second mode selection signal is at the prescribed logic level, said stop signal for stopping the circuit for generating precharge voltage for bit line is at the prescribed logic level; and said address signals are combinably applied to output said stop signal for stopping the circuit for generating precharge voltage for bit line irrespective of said signal for selecting a wafer-level burn-in, said first mode selection signal, and said second selection signal.

4. A circuit for supplying a stress to memory cells according to claim 3, wherein said prescribed logic level is an H level.

5. A method of supplying a stress to memory cells of a semiconductor memory device comprising:

a step of selecting from among a mode for simultaneously activating word lines arranged in odd order designated by a first word line mode selection signal, a mode for simultaneously selecting word lines arranged in even order designated by a second word line mode selection signal, and a mode for simultaneously activating the whole word lines, a step of selecting execution of a wafer-level burn-in test, a step of outputting a stop signal at a prescribed logic level for stopping output of precharge voltage for bit line when the wafer-level burn-in test mode signal is at the prescribed logic level and one of said first and second word line mode selection signals is simultaneously at said prescribed logic level, a step of floating a precharge voltage for bit line upon receipt of said stop signal for stopping output of precharge voltage for bit line, and a step of supplying an arbitrary voltage to said memory cells as the stress after said stop signal for stopping output of precharge voltage for bit line is output.

6. A method of supplying a stress to memory cells of a semiconductor memory device in accordance with claim 5, wherein said prescribed logic level is an H level.

7. A method of supplying a stress to memory cells of a semiconductor memory device comprising:

a step of selecting from among a mode for simultaneously activating word lines arranged in odd order designated by a first word line mode selection signal, a mode for simultaneously selecting word lines arranged in even order designated by a second word line mode selection signal, and a mode for simultaneously activating the whole word lines, a step of selecting execution of a wafer-level burn-in test, a step of outputting a first stop signal at a prescribed logic level for stopping output of precharge voltage for bit line when the wafer-level burn-in test mode signal is at the prescribed logic level and one of said first and second word line mode selection signals is simultaneously at said prescribed logic level, a step of floating a precharge voltage for bit line upon receipt of said first stop signal at said predetermined logic level for stopping output of precharge voltage for bit line, a step of supplying an arbitrary voltage to said memory cells as the stress after said first stop signal for stopping output of the precharge voltage for bit line is output, a step of selecting execution of a test other than the wafer-level burn-in test by means of address signals, a step of determining whether or not a second stop signal for stopping output of precharge voltage for bit line is output when execution of said other test is selected, a step of floating the precharge voltage for bit line upon receipt of said second stop signal for stopping output of precharge voltage for bit line, and a step of supplying an arbitrary voltage to said memory cells as the stress after said second stop signal for stopping output of the precharge voltage for bit line is output.

8. A method of supplying a stress to memory cells of a semiconductor memory device in accordance with claim 7, wherein said prescribed logic level is an H level.

* * * * *